United States Patent
Fujinami

(10) Patent No.: US 8,524,333 B2
(45) Date of Patent: Sep. 3, 2013

(54) METHOD OF MANUFACTURING GAS BARRIER FILM

(75) Inventor: Tatsuya Fujinami, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 156 days.

(21) Appl. No.: 13/044,024

(22) Filed: Mar. 9, 2011

(65) Prior Publication Data

US 2011/0223358 A1    Sep. 15, 2011

(30) Foreign Application Priority Data

Mar. 9, 2010  (JP) ................. 2010-051346

(51) Int. Cl.
*C23C 16/34* (2006.01)
*C23C 16/52* (2006.01)

(52) U.S. Cl.
USPC ................ 427/579; 427/569; 427/578

(58) Field of Classification Search
None
See application file for complete search history.

(56) References Cited

U.S. PATENT DOCUMENTS

| | | | |
|---|---|---|---|
| 2007/0137568 A1* | 6/2007 | Schreiber | 118/718 |
| 2008/0036705 A1* | 2/2008 | Iwashita et al. | 345/76 |
| 2009/0159566 A1* | 6/2009 | Brillhart et al. | 216/58 |
| 2009/0197101 A1* | 8/2009 | Nakagame et al. | 428/447 |
| 2009/0220803 A1* | 9/2009 | Fujinami | 428/446 |
| 2009/0252893 A1* | 10/2009 | Ozaki et al. | 427/579 |

FOREIGN PATENT DOCUMENTS

JP    2009-179874    8/2009

* cited by examiner

*Primary Examiner* — Joseph Miller, Jr.
(74) *Attorney, Agent, or Firm* — Young & Thompson

(57) ABSTRACT

The method of manufacturing a gas barrier film feeds long lengths of a substrate and forms a silicon nitride film as the gas barrier film on the substrate by a capacitively coupled plasma-enhanced CVD technique while transporting the substrate in a longitudinal direction. Gaseous raw materials using in the forming step of the silicon nitride film includes at least silane gas and ammonia gas, and a ratio P/Q [W/sccm] is not less than 1 when a flow rate of the silane gas is denoted as Q [sccm] and a power input for generating a capacitively coupled plasma is denoted as P [W], a tension applied to the substrate transported between two transporting elements is not more than 100 [N/m], and a pair of electrodes for at least forming the silicon nitride film on the substrate is interposed between the two transporting elements.

16 Claims, 1 Drawing Sheet

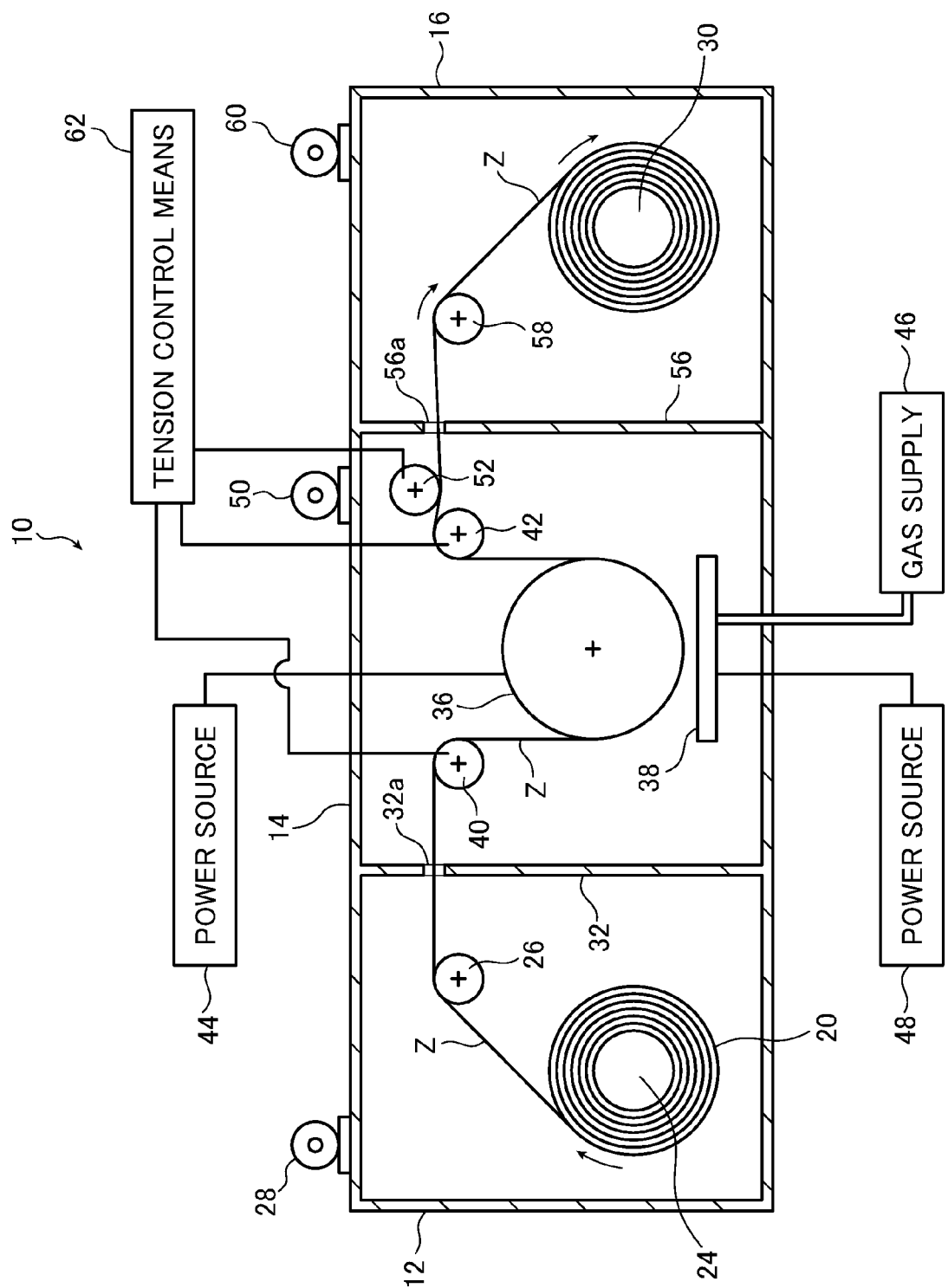

_US 8,524,333 B2_

METHOD OF MANUFACTURING GAS BARRIER FILM

BACKGROUND OF THE INVENTION (1.) Field of the Invention

The present invention relates to a method of manufacturing a gas barrier film using a capacitively coupled plasma-enhanced chemical vapor deposition (CVD) technique.

(2.) Description of the Related Art

Gas barrier films having a silicon nitride film formed on the surface of a resin (plastic) film are known as gas (water vapor) barrier films employed in various apparatuses and optical devices which are required to be moisture-proof.

Capacitively coupled plasma chemical vapor deposition (hereinafter abbreviated as "CCP-CVD") is known as a process for forming a silicon nitride film.

As is well known, CCP-CVD is a technique in which a gaseous raw material is supplied between a deployed pair of electrodes, and a voltage is applied to generate plasma, which causes the gaseous raw material to dissociate and ionize to generate radicals and ions, thus performing film formation by means of plasma CVD on the surface of an object disposed between the electrodes.

The CCP-CVD method is advantageous in that, because the gaseous raw material is supplied from the electrodes in a simple structure, gas can be uniformly supplied to the whole film-forming area (gas is easily made uniform) even in the case where the electrodes have an increased surface area, and hence this technique can be easily applied to a substrate having a large surface area.

For example, JP 2009-179874 A discloses a method of forming a gas barrier layer having a ratio P/Q of 0.4 to 40, when the RF power required to form a silicon nitride film is P (W), and the total flow rate of silane gas, ammonia gas, and nitrogen gas is Q (sccm).

In the method disclosed in JP 2009-179874 A, a silicon nitride film having excellent gas barrier properties can be produced at a high film formation rate by setting the ratio P/Q to 0.4 to 40 and increasing the RF power per the total flow rate of the gases.

When producing a gas barrier layer, the roll-to-roll film-forming method is generally known as being an efficient method for forming a film on a substrate while ensuring high productivity.

The roll-to-roll film formation apparatus continuously forms a film on a substrate in the film formation chamber while synchronously feeding the substrate from the feed roll to the take-up roll along a predetermined pathway extending from the feed roll upon which the lengthy substrate (web-shaped substrate) is wound in a roll-shaped manner, to the take-up roll upon which the substrate is subsequently wound in a roll-shaped manner after passing through the film formation chamber where the film is formed on the substrate.

However, the substrate may be softened by the large amount of heat applied to the substrate during the film formation when the RF power per gas flow rate is increased to form a silicon nitride film with excellent gas barrier properties at a high film formation rate, as described in JP 2009-179874 A. Therefore, the softened substrate is susceptible to deformation by the load applied to the substrate during feeding, thus causing damage to the silicon nitride film formed on the substrate and degrading the gas barrier properties when forming a film under high power using the roll-to-roll method, as in the method disclosed in JP 2009-179874 A.

An object of the present invention is to solve the above-mentioned problems of the prior art by providing a method of manufacturing a gas barrier film capable of forming a silicon nitride film having excellent gas barrier properties with high productivity, and reducing deformation of the substrate when feeding the substrate, even when RF power per gas total flow rate is increased to improve productivity and gas barrier properties, when forming a silicon nitride film on a substrate by means of capacitively coupled plasma CVD while feeding the lengthy substrate in the longitudinal direction.

SUMMARY OF THE INVENTION

In order to achieve the above object, according to the present invention, there is provided A method of manufacturing a gas barrier film, including: feeding long lengths of a substrate: and forming a silicon nitride film as said gas barrier film on said substrate by a capacitively coupled plasma-enhanced CVD technique while transporting said substrate in a longitudinal direction, wherein gaseous raw materials using in said forming step of said silicon nitride film includes at least silane gas and ammonia gas, and wherein a ratio P/Q [W/sccm] is not less than 1 when a flow rate of the silane gas is denoted as Q [sccm] and a power input for generating a capacitively coupled plasma is denoted as P [W], and a tension applied to said substrate transported between two transporting means is not more than 100 [N/m], a pair of electrodes for at least forming said silicon nitride film on said substrate being interposed between said two transporting means.

In the method of manufacturing a gas barrier film according to the present invention, it is preferable that the step of forming said silicon nitride film performs by applying a bias potential to said substrate. Further, it is preferable that the said bias potential applied to said substrate is not more than −100V.

Further, it is preferable that the substrate is transported by winding said substrate at a predetermined area of a circumferential surface of a cylindrical drum, and said cylindrical drum is used as one electrode of said pair of electrodes in case of forming said silicon nitride film. Further, it is preferable that the tension applied to said substrate is not more than 100 [N/m] in an area of said circumferential surface of said cylindrical drum on which said substrate is wound.

Further, it is preferable that the ratio P/Q satisfies a relationship 1 [W/sccm]≦P/Q≦30 [W/sccm]. Further, it is preferable that the tension applied to said substrate is not more than 100 [N/m] in an entire area of a transporting path for transporting said substrate in said longitudinal direction.

Further, it is preferable that the gaseous raw materials further includes at least one of nitrogen gas and hydrogen gas. Further, it is preferable that the tension applied to said substrate is measured by tension measuring means provided in a transporting path for transporting said substrate in said longitudinal direction. Further, it is preferable that a temperature of said substrate is not more than 70° C. Furthermore, it is preferable that a temperature of said cylindrical drum is adjusted by temperature adjusting means provided for said cylindrical drum.

According to the present invention having the above-mentioned configuration, when forming a silicon nitride film on a substrate by means of capacitively coupled plasma CVD while the lengthy substrate is fed in the longitudinal direction, it is possible to reduce the deformation of the substrate when feeding the substrate, to prevent the degradation of gas barrier properties caused by such deformation, and to produce a silicon nitride film with excellent gas barrier properties at a high film formation rate and high productivity even when the RF power per gas total flow rate is increased to improve productivity and gas barrier properties.

BRIEF DESCRIPTION OF THE DRAWINGS

FIG. 1 is a conceptual diagram showing an example of the plasma CVD device used in the method of manufacturing a gas barrier film of the present invention.

DETAILED DESCRIPTION OF THE INVENTION

The method of manufacturing a gas barrier film according to the present invention is described in detail hereinafter with reference to the accompanying drawing.

FIG. 1 conceptually shows an example of a plasma CVD device used in the method of manufacturing a gas barrier film of the present invention.

The plasma CVD device 10 (hereinafter referred to as "CVD device 10") shown in FIG. 1 is a device with which a silicon nitride film serving as a gas barrier layer is formed (deposited) on the surface of a substrate Z (base material to be treated/substrate) by a capacitively coupled plasma-enhanced chemical vapor deposition (CCP-CVD) technique to produce a gas barrier film.

The illustrated plasma CVD device 10 produces a gas barrier film by forming (producing or depositing) a silicon nitride film by plasma CVD on a surface of a lengthy substrate Z (a film raw material) while transporting it in a longitudinal direction.

This CVD device 10 is a film formation apparatus using the so-called roll-to-roll system in which the substrate Z is fed and transported from a substrate roll 20, upon which the lengthy substrate Z is wound in a roll-shaped manner, a functional layer is formed on the substrate Z while transporting it in the longitudinal direction, and the substrate Z with the functional layer formed thereon (that is, the functional film) is subsequently wound into a roll.

In roll-to-roll film formation apparatuses, the substrate Z is usually fed under tension so that the substrate Z does not sag during the feeding or transporting.

In the CVD device 10 of the present invention, the rotation speed of the motors of each roller and drum 36, roller displacement, and the like are controlled so that the tension during feeding or transporting (feeding or transporting tension) is a predetermined value of 100 N/m less or equal in the feeding or transporting system from the rotary shaft 24 on which the substrate roll 20 for supplying the substrate Z is mounted described later, to the winding shaft 30 onto which the substrate Z is wound after film formation.

As described above, the CVD device 10 shown in FIG. 1 is a film formation apparatus for depositing a film on the surface of the substrate Z by CCP-CVD (capacitively coupled plasma CVD method), employing the so-called roll-to-roll system in which a functional layer is formed on the substrate Z while feeding the substrate Z in a longitudinal direction from substrate roll 20, upon which the lengthy substrate Z has been wound, and subsequently the substrate Z is rewound on a roll. The CVD device 10 includes a supply chamber 12, a film formation chamber 14, a winding chamber 16, and tension control means 62.

Note that, in addition to the members shown in the figure, the CVD device 10 may also have various members which comprise a film formation apparatus using a plasma CVD device employing a roll-to-roll system, including various sensors and various members (feeding or transporting means) for feeding or transporting the substrate Z along a predetermined path such as a feeding roller pair and a guide member for regulating the position in the width direction of the substrate Z. In addition, the CVD device 10 may include a plurality of plasma CVD film formation chambers. Alternatively, at least one film formation chamber for forming a film by any means such as vapor deposition techniques other than plasma CVD, flash evaporation, and sputtering, and/or at least one surface treatment chamber for plasma processing and the like may be connected to the CVD device.

As will be described later, the present invention basically deposits a silicon nitride film on the surface of the substrate Z by means of a general CCP-CVD method using at least silane gas and ammonia gas as gases raw materials in a usual CVD device 10 with the exception of the relationship between the silane gas temperature and the power mainly applied for plasma generation, and the feeding tension applied on the substrate Z when feeding the substrate Z.

In the present invention, the substrate Z (base material to be treated) is not particularly limited, and all the objects (products) are usable insofar as a silicon nitride film can be formed by CCP-CVD using silane gas, ammonia gas, hydrogen gas, and/or nitrogen gas as gases raw materials.

In the present invention, the substrate Z may have any of the various films as the body (substrate) on the surface (on at least the film formation surface) of which may form a layer (film) made of organic materials or inorganic materials to provide various functions such as a protective layer, an adhesive layer, a light reflecting layer, a light shield layer, a planarizing layer, a buffer layer, and a stress relaxing layer.

The supply chamber 12 includes a rotary shaft 24, a guide roller 26 and vacuum evacuation means 28.

The substrate roll 20 onto which a long length of substrate Z is wound is mounted on the rotary shaft 24 in the supply chamber 12.

Upon mounting of the substrate roll 20 on the rotary shaft 24, the substrate Z is fed (conveyed) along a predetermined feeding path starting from the supply chamber 12 and passing through the film formation chamber 14 to reach a winding shaft 30 in the winding chamber 16.

Feeding of the substrate Z from the substrate roll 20 and winding of the substrate Z on the winding shaft 30 of the winding chamber 16 are carried out synchronously in the production device 10 to continuously form the functional film on the lengthy substrate Z in the film formation chamber 14 by plasma CVD (CCP-CVD) while feeding the lengthy substrate Z in the longitudinal direction along the predetermined feeding path.

In the supply chamber 12, the rotary shaft 24 is rotated by a drive source (not shown) in a clockwise direction in FIG. 1 so that the substrate Z is fed from the substrate roll 20, is guided by the guide roller 26 along the predetermined path and passes through a slit 32a provided in a partition wall 32 to reach the film formation chamber 14.

The illustrated production device 10 comprises vacuum evacuation means 28 and 60 in the supply chamber 12 and the winding chamber 16, respectively, as a preferred embodiment. The vacuum evacuation means are provided in these chambers to ensure that these chambers have the same degree of vacuum (pressure) during film formation as the film formation chamber 14 described later so that the pressures inside these adjacent chambers do not affect the degree of vacuum inside the film formation chamber 14 (formation of the functional layer).

The vacuum evacuation means 28 is not particularly limited, and exemplary means that may be used include vacuum pumps such as a turbo pump, a mechanical booster pump, a dry pump, and a rotary pump, assist means such as a cryogenic coil, and various other known (vacuum) evacuation means which are used for adjusting the ultimate degree of vacuum and the evacuation amount, and are employed in vacuum film formation apparatuses. In this regard, the same holds true for other vacuum evacuation means 50 and 60 described later.

The present invention is not limited to a configuration wherein all the chambers are provided with vacuum evacuation means; the supply chamber 12 and the winding chamber 16 requiring no vacuum evacuation treatment may not be provided with vacuum evacuation means. However, in order to minimize the adverse effect of the pressures in these chambers on the degree of vacuum in the film formation chamber 14, the size of the portion such as the slit 32a through which the substrate Z passes may be made as small as possible, or a sub-chamber may be provided between the adjacent chambers so that the internal pressure of the sub-chamber can be reduced.

Even in the illustrated production device 10 in which all the chambers have the vacuum evacuation means, it is preferred to minimize the size of the portion such as the slit 32a through which the substrate Z passes.

The tension control means 62 controls the displacement of the tension control roller 52 (hereinafter referred to as "control roller 52") in the film formation chamber 14 based on the feeding tension applied to the substrate Z measured by the tension pick-up rollers 40 and 42 in the film formation chamber 14, so that the feeding tension applied to the substrate Z fed through the predetermined path becomes a predetermined value of 100 [N] less or equal per 1 [m] of substrate width (length in a direction perpendicular to the feeding direction).

The substrate Z is fed through the predetermined path under a predetermined tension of 100 [N/m] less or equal by the control of the tension control means 62.

As described above, the substrate Z is guided by the guide roller 26 to reach the film formation chamber 14.

The film formation chamber 14 is used to deposit or form a functional layer on a surface of the substrate Z by capacitively coupled plasma CVD (CCP-CVD).

In the illustrated example, the film formation chamber 14 includes a drum 36, a shower head electrode 38, tension pick-up rollers 40 and 42, a bias power source 44, gas supply means 46, an RF power source 48, a vacuum evacuation means 50, and a control roller 52. The tension control means 62 is connected to the pick-up rollers 40 and 42, and the control roller 52.

The drum 36 in the film formation chamber 14 is a cylindrical member rotating around the central axis in the counterclockwise direction in FIG. 1, and the substrate Z guided by the tension pick-up roller 40 along the predetermined path is wrapped over a predetermined region of the peripheral surface to feed in the longitudinal direction while holding the substrate Z at a predetermined position facing the shower head electrode 38, as described later.

Although not shown, the drum 36 of the illustrated CVD device 10 preferably has built-in temperature adjusting means to regulate the temperature of the substrate Z during the formation of the silicon nitride film.

The temperature adjusting means regulates the temperature of the substrate Z to reduce the deformation of the substrate Z due to heat described later.

Note that, in the present invention, the temperature of the substrate Z is not particularly limited insofar as the temperature allows the formation of the silicon nitride film in accordance with film formation conditions and the like; however, a temperature of 70° C. less or equal is preferable from the standpoint of suitably reducing the deformation of the substrate Z due to heat.

The temperature adjusting means is not particularly limited, and all known means may be used insofar as such means is capable of adjusting the temperature of the substrate Z during film formation, such as cooling means using a piezo element and temperature adjusting means that provides a flow of a temperature adjusting liquid within the drum 36 (a predetermined flow path in the drum 36).

In the illustrated example, the drum 36 is connected to the bias power source 44 and operates as one electrode (counter electrode to the electrode to which the main power is supplied for plasma generation) of the pair of electrodes in forming a film by CCP-CVD. That is, the drum 36 in the illustrated case also serves as the counter electrode of the shower head electrode 38 to which the main power for plasma generation is supplied.

The bias power source 44 is an RF power source which supplies bias voltage to the drum 36.

The formed film can be made dense to improve the gas barrier properties by applying a bias voltage to the substrate Z. The present invention can be used more suitably when the tension applied to the fed substrate Z is set to 100 N/m less or equal due to the increase in the amount of heat applied to the substrate Z by the application of the bias voltage.

Note that the bias power source 44 is not limited to the RF power source of the illustration, insofar as various types of power sources used to apply a bias potential to the substrate Z such as a DC pulsed power source may be used in CCP-CVD.

Note that, although the bias voltage applied to the drum 36 is not particularly limited in the present invention, a bias voltage of −100 V less or equal is preferred from the standpoint of obtaining sufficient productivity improvement and improvement of film properties (improvement of gas barrier properties).

Furthermore, although the lower limit of the bias voltage is not particularly specified, it is preferable that the bias voltage is −700 V or more.

By setting the lower limit of the bias voltage of the substrate Z to −700 V or more, more preferred results can be obtained in that a decrease in the gas barrier properties resulting from ion bombardment on the substrate Z due to a too strong effect of the bias voltage (due to the bias voltage having too large an absolute value) can be certainly prevented.

The drum 36 may, as necessary, be connected not only to the bias power source 44 but also to ground (grounding means) so as to be capable of switching between the connection to the drum 36 and bias power source 44, and the connection to the drum 36 and ground. The drum 36 also may be switchable to a floating potential (insulation potential).

The shower head electrode 38 in the illustration is, for example, a hollow rectangular solid and is disposed so that its largest surface faces the drum 36, which operates as an electrode and holds the substrate Z.

The shower head electrode 38 is an electrode to which the main power for plasma generation is supplied, and is combined with the drum 36 to form an electrode pair for carrying out CCP-CVD. The shower head electrode 38 is connected to the RF power source 48 described later.

A large number of through holes are formed over the entire surface of the shower head electrode 38 facing the drum 36. In addition, the shower head electrode 38 is connected to the gas supply means 46, which supplies a gaseous raw material into the interior of the shower head electrode 38.

That is, the shower head electrode 38 operates not only as an electrode but also as gaseous raw material introduction means; the gaseous raw material supplied from the gas supply means 46 into the interior of the shower head electrode 38 is then supplied through the through holes formed on the surface facing the drum 36 to the space between the shower head electrode 38 and the drum 36 that also functions as an electrode.

The gas supply means 46 is known gas supply means employed in plasma CVD devices and sputtering devices.

In the present invention, the gas supply means 46 supplies at least silane gas and ammonia gas to the shower head electrode 38. In addition to these gases, the gas supply means 46 may, as necessary, supply hydrogen gas, nitrogen gas, and inert gases such as argon gas to the shower head electrode 38 as auxiliary gases.

Note that the present invention is not limited to the configuration of using the shower head electrode as the gaseous raw material introduction means; the electrode that supplies the main power for plasma generation serves as the electrode only, and various types of gas introduction means used in plasma CVD devices may be employed; for example, a nozzle or shower head nozzle for supplying gas that is provided in the space between the electrode and the drum 36 from which the gaseous raw material is supplied.

As described above, the shower head electrode 38 is connected to the RF power source 48.

The RF power source 48 is a power source for supplying the main power for plasma generation in CCP-CVD to the shower head electrode 38, and various known RF power sources employed in plasma CVD devices may be used.

The RF power source 48 may, as necessary, supply plasma excitation power to the shower head electrode 38 through a known matching device (matching circuit) for impedance matching of the RF power.

The tension pick-up rollers 40 and 42 are for measuring the feeding tension applied on the fed substrate Z and guiding the fed substrate Z in a predetermined path.

The tension pick-up roller 40 is provided upstream of the drum 36 in the feeding direction of the substrate Z. The tension pick-up roller 42 is provided downstream of the drum 36 in the feeding direction of the substrate Z. That is, the tension pick-up rollers 40 and 42 measure the feeding tension of the substrate Z upstream and downstream of the area (film formation area) facing the electrode pair of the shower head electrode 38 and the drum 36 during film formation on the substrate Z.

In the present invention, various known tension pick-up rollers used in roll-to-roll type plasma CVD devices, such as those which detect tension using load cell and those which detect tension by measuring roller displacement, may be used as the tension pick-up rollers 40 and 42 that measure the feeding tension of the substrate Z.

Although two tension pick-up rollers 40 and 42 are provided in the illustrated plasma CVD device 10, the present invention is not limited to this arrangement, insofar as a single tension pick-up roller also may be provided. Note that when a single tension pick-up roller is used, a suitable guide roller may be optionally provided to guide the substrate Z.

Although the tension pick-up rollers 40 and 42 are disposed within the film formation chamber 14, the present invention is not limited to this configuration, insofar as the tension pick-up rollers also may be provided in another chamber, such as the gas supply chamber and winding chamber.

The tension pick-up rollers 40 and 42 send the measurement results of the feeding tension of the substrate Z to the tension control means 62.

The control roller 52 is for adding tension for feeding the substrate Z.

The control roller 52 is disposed downstream of the tension pick-up roller 42 in the feeding direction of the substrate Z.

The control roller 52 moves in a direction approximately perpendicular to the surface of the substrate to add tension to the substrate Z so that the tension for feeding the substrate Z is a predetermined value of 100 N/m less or equal according to the signals from the tension control means 62.

When the control roller 52 adds tension, the feeding tension applied to the substrate Z becomes a predetermined value of 100 N/m less or equal and across the whole feeding path.

Although the control roller 52 is disposed within the film formation chamber 14 in the illustrated CVD device 10, the present invention is not limited to this configuration, insofar as the control roller 52 also may be disposed in the supply chamber and winding chamber.

The operation of adjusting the feeding tension in the CVD device 10 is described below.

In the CVD device 10, the feeding tension of the tension control means 62 is set to a predetermined value of 100 N/m less or equal (alternatively, the operator can set the feeding tension to 100 N/m less or equal according to the film formation conditions and the type of substrate Z).

As previously described, when film formation starts in the CVD device 10, the lengthy substrate Z is fed through a predetermined feeding path from the substrate roll 20 (rotary shaft 24) to the winding shaft 30.

The tension pick-up rollers 40 and 42 measure the feeding tension applied to the substrate Z during the feeding, and transmit the measurement results to the tension control means 62.

The tension control means 62 transmits the signals of the displacement amount of the control roller 52 to the control roller 52 to adjust the feeding tension applied to the substrate Z to the set value (predetermined value of 100 N/m) based on the feeding tension measurement results received from the tension pick-up rollers 40 and 42.

The control roller 52 moves in a direction approximately perpendicular to the substrate surface to adjust the tension applied to the substrate Z according to the signals received from the tension control means 62 so that the tension applied to the substrate Z matches the set value (predetermined value of 100 N/m).

Note that the feeding tension may be always adjusted during the feeding of the substrate Z (during film formation), may be adjusted at predetermined time intervals, or may be adjusted when the difference between the measured feeding tension and the set feeding tension exceeds a predetermined value.

The vacuum evacuation means 50 evacuates the film formation chamber 14 to keep it at a predetermined film formation pressure in order to form the functional layer by plasma CVD, and is known vacuum evacuation means used in vacuum film formation apparatuses as described above.

The present invention forms a silicon nitride film on the surface of the substrate Z by CCP-CVD using at least silane gas ($SiH_4$) and ammonia gas ($NH_3$) as gaseous raw materials, and the ratio P/Q is not less 1 [W/sccm] when the silane gas flow is Q [sccm] and the main power input to generate the plasma is P [W], and the tension applied to the fed substrate Z is set to 100 [N/m] less or equal between at least two feeding means with the pair of electrodes (drum 36 and shower head electrode 38) for forming a film on the substrate Z interposed therebetween during film formation.

That is, in the illustrated CVD device 10, a silicon nitride film is formed on the surface of the substrate Z by CCP-CVD using at least silane gas and ammonia gas supplied from the gas supply means 46 with the ratio of the silane gas flow Q supplied from the gas supply means 46 and the input power P supplied from the RF power source 48 to the shower head electrode 38 set to P/Q≧1 [W/sccm] and with the substrate Z fed through a predetermined path from the supply chamber 12, through the film formation chamber 14, to be wound on the winding shaft 30 of the winding chamber 16 while the control roller 52 applies a feeding tension of 100 [N/m] less or equal to the substrate Z during the feeding.

According to investigations of the inventors, the silicon nitride film formed on the substrate become denser and the gas barrier properties are improved by increasing the main power P applied to generate the plasma in CCP-CVD relative to the silane gas flow Q, that is, by increasing the power P applied to the shower head electrode 38 in the CVD device 10 shown in FIG. 1.

However, when the main power P (power input to the shower head electrode 38) supplied to generate the plasma is increased, the substrate Z may be softened by the heat as the amount of heat applied to the substrate Z increases during film formation. In general, a tension is applied to the substrate Z for feeding when film formation is performed while feeding the lengthy substrate Z in the longitudinal direction as in the roll-to-roll system. Therefore, the substrate Z softened by heat during film formation may be deformed by the feeding tension, thus damaging the silicon nitride film formed on the substrate Z and degrading the gas barrier properties.

In contrast, the present invention produces a film having excellent gas barrier properties, increases the film formation rate to improve productivity, and reduces deterioration of gas barrier properties by preventing damage to the film caused by the deformation of the substrate by increasing the RF power per the total flow of the gas by setting the main power P applied to generate plasma relative to the silane gas flow Q so that P/Q≧1, and setting the feeding tension applied to the substrate Z to 100 [N/m] less or equal at least between the two feeding means with an electrode pair interposed therebetween during film formation on the substrate Z.

In the present invention, the relation P/Q [W/sccm] between the main power P [W] supplied to the electrode for plasma generation and the silane gas flow rate Q [sccm] is 1 W/sccm or more.

If P/Q is less than 1 W/sccm, the silicon nitride film can not be densely formed on the substrate Z, and the formed film does not exhibit sufficient gas barrier properties.

Note that although the upper limit of P/Q is not particularly limited, P/Q is preferably 30 W/sccm less or equal.

If P/Q exceeds 30 W/sccm, there is increasing damage to the substrate during film formation, causing to roughen the surface of the substrate. A dense silicon nitride film therefore is not obtained, resulting in degrading the gas barrier properties of the formed silicon nitride film.

Note that the flow rates of silane gas and ammonia gas are not particularly limited and may be determined as appropriate for the required film formation rate and film formation area so that the above-described conditions are met.

The gaseous raw material preferably includes at least one of hydrogen gas and nitrogen gas.

Hydrogen gas and nitrogen gas mainly serve as dilution gases. Hydrogen gas or nitrogen gas, or both may be used.

Use of hydrogen gas is advantageous in that incorporation of hydrogen into the silicon nitride film can be suppressed. Use of nitrogen gas is advantageous with respect to the film formation rate because it also serves as a nitrogen source of the silicon nitride film.

Note that the flow rates of hydrogen gas and nitrogen gas are also not particularly limited and may be determined as appropriate for the required film formation rate. Hydrogen gas and nitrogen gas are preferably used at flow rates 5 to 10 times the flow rate of silane gas. In cases where hydrogen gas and nitrogen gas are used in combination, the total flow rate of both the gases is preferably 5 to 10 times the flow rate of silane gas.

The intensity of the main power P for plasma generation, that is, the power P supplied to the shower head electrode 38 in the illustrated case, is not particularly limited, and may be set as appropriate for the required film formation rate, and, therefore, the power mentioned in the scope of the present invention may be set as appropriate according to the silane gas flow.

The frequency of this power is also not particularly limited, and power at various frequencies employed in forming a silicon nitride film by CCP-CVD may be applicable.

In the present invention, the film formation pressure is not particularly limited insofar as the film formation pressure allows the formation of a silicon nitride film according to the film formation conditions.

The substrate Z having the functional layer formed thereon (i.e., functional film) is fed from the drum 36 to the tension pick-up roller 42 and is guided by the tension pick-up roller 42 to pass through the slit 56a formed in a partition wall 56 separating the film formation chamber 14 from the winding chamber 16, thus reaching the winding chamber 16.

In the illustrated example, the winding chamber 16 includes the guide roller 58, the winding shaft 30, and the vacuum evacuation means 60.

The substrate Z (functional film) fed to the winding chamber 16 is guided by the guide roller 58 to be fed to the winding shaft 30, where the functional film is wound into a roll by the winding shaft 30, which is then used in the subsequent step as a roll of functional film.

The winding chamber 16 is also provided with the vacuum evacuation means 60 as in the above-described supply chamber 12, and during film formation, its pressure is reduced in accordance with the film formation pressure in the film formation chamber 14.

The CVD device 10 shown in FIG. 1 is a so-called roll-to-roll type device that deposits a film as the lengthy substrate Z is fed in the longitudinal direction of the substrate and wound on a drum. However, the method of manufacturing a gas barrier film of the present invention is not specifically limited, and a roll-to-roll type device is also preferred in which a pair of electrodes in plate form are disposed in a film formation chamber so as to face each other, a lengthy substrate is fed in its longitudinal direction so as to pass between the electrodes, and a gaseous raw material is supplied between the substrate and the electrode to carry out film formation by means of CCP-CVD.

Although the CVD device 10 is provided with tension pick-up rollers 40 and 42 to measure the feeding tension applied to the substrate Z and control the feeding tension applied to the substrate Z based on the tension measurement results, the present invention is not limited to this configuration, insofar as measurement means for measuring the feeding tension, such as a tension pick-up roller, may be provided if the feeding tension applied on the substrate Z is not more than 100 N/m. For example, the feeding tension need not be measured during the operation of the device by presetting the position of the roller and number of rotations of the motor for driving the roller so that the feeding tension is set to 100 N/m less or equal prior to the operation of the device.

Note that it is preferable that the tension pick-up roller (tension measuring means) is provided to stabilize the feeding tension applied to the substrate Z by controlling the feeding tension based on the feeding tension measurement results.

Although the feeding tension applied on the substrate Z is adjusted by providing the control roller 52 in the CVD device 10, the present invention is not limited to this configuration insofar as the feeding tension applied on the substrate Z is not more than 100 N/m. For example, the feeding tension can be set to a predetermined value of 100 N/m less or equal by controlling the torque of at least one of the rotary shaft for supplying the substrate Z and the winding shaft for taking up the substrate Z. Note that the feeding speed of the substrate Z is controlled to be constant even when the feeding tension is adjusted by controlling the torque of the rotary shaft and winding shaft.

Although the feeding tension is set to 100 N/m less or equal in the entire feeding path from the substrate Z supply roller 20 (rotary shaft 24) to the take-up roller 30 in the CVD device 10, the present invention is not limited to this configuration insofar as the feeding tension applied on the substrate Z also may be 100 N/m less or equal at least between the two feeding means (guide rollers 26 and 58) with the pair of electrodes (drum 36 and shower head electrode 38) for forming the film interposed therebetween.

Note that it is preferable that the feeding tension for the substrate Z is set to 100 N/m less or equal in the entire feeding path from the supply roller 20 (rotary shaft 24) to the winding chamber 30.

While the method of manufacturing a gas barrier film according to the present invention has been described above in detail, the present invention is by no means limited to the foregoing examples and it should be understood that various improvements and modifications may of course be made without departing from the scope and spirit of the present invention.

WORKING EXAMPLES

Next, the present invention is described in further detail by referring to the following working examples.

Working Example 1

The CVD device 10 shown in FIG. 1 was used to deposit a silicon nitride film with a thickness of 100 nm on the surface of a substrate Z, thus manufacturing a gas barrier film.

The substrate Z used was a PET film (Cosmoshine A4300 available from Toyobo Co., Ltd.) with a thickness of 100 μm and width of 1,000 mm. Note that the length of the formed film was 1,000 m.

Note also that the feeding tension applied on the substrate Z was 50 N/m.

As gaseous raw materials, silane gas ($SiH_4$) (flow rate 100 sccm), ammonia gas ($NH_3$) (flow rate 300 sccm), and nitrogen gas ($N_2$) (flow rate 500 sccm) were used.

A drum formed of SUS304 parent material, having a major diameter of 1,000 mm and surface-plated with hard chrome was used. The drum also had built-in temperature adjusting means.

The pressure of the film formation chamber (vacuum chamber) was set to 50 Pa.

During film formation, the temperature adjusting means built in the drum was used to adjust the temperature of the substrate to 70° C.

The thickness of the functional layer to form was 100 nm.

A power source at a frequency of 200 kHz was used as the bias power source connected to the drum, and the output was adjusted to apply a potential of −100 V to the drum.

An RF power source at a frequency of 13.56 MHz was used as the RF power source connected to the shower head electrode, and the output was set to supply power of 500 W to the shower head electrode.

That is, the ratio of the power supplied to the shower head electrode 38 to the silane gas flow rate (P/Q) in the present working example was P/Q=500 W/100 sccm=5 W/sccm.

Working Examples 2 to 4

Settings were identical to Working example 1 with the exception that the power supplied from the RF power source to the shower head electrode was changed to 100 W, that is, the ratio P/Q was changed to 1 W/sccm, and the bias potential applied from the bias power source to the drum was changed to 0 V (ground) (Working example 2).

Settings were identical to Working example 1 with the exception that the bias potential applied from the bias power source to the drum was changed to 0 V (ground) (Working example 3).

Settings were identical to Working example 1 with the exception that the feeding tension applied to the substrate Z was changed to 95 N/m (Working example 4). In all working examples, a gas barrier film was produced by forming a silicon nitride film on the surface of the substrate Z.

Comparative Example 1

Settings were identical to Working example 1 with the exception that the feeding tension applied to the substrate Z was changed to 120 N/m. A gas barrier film was produced by forming a silicon nitride film on the surface of the substrate Z.

Comparative Example 2

Settings were identical to Working example 2 with the exception that the feeding tension applied to the substrate Z was changed to 120 N/m. A gas barrier film was produced by forming a silicon nitride film on the surface of the substrate Z.

Comparative Example 3

Settings were identical to Working example 3 with the exception that the feeding tension applied to the substrate Z was changed to 120 N/m. A gas barrier film was produced by forming a silicon nitride film on the surface of the substrate Z.

Comparative Examples 4 to 5

The settings were identical with Working example 4 with the exception that the power supplied from the RF power source to the shower head electrode was changed to 80 W, that is, the ratio P/Q was changed to 0.8 W/sccm (Comparative example 4).

The settings were identical with Working example 4 with the exception that the power supplied from the RF power source to the shower head electrode was changed to 80 W, that is, the ratio P/Q was changed to 0.8 W/sccm, and the feeding tension applied to the substrate Z was changed to 120 N/m (Comparative example 5). In both comparative examples, a gas barrier film was produced by forming a silicon nitride film on the surface of the substrate Z.

The gas barrier properties of each of the obtained gas barrier films were examined.

[Gas Barrier Properties]

The water vapor transmission rate (WVTR) [$g/m^2/day$] was measured using a water vapor transmission rate instrument AQUATRAN available from MOCON, Inc.

The measurement results are shown in Table 1 below.

TABLE 1

| | Film formation conditions | | | Evaluation results |
|---|---|---|---|---|
| | RF power | P/Q | Bias | Feeding tension | WVTR |
| Working example 1 | 500 | 5 | −100 | 50 | 0.01 less or equal |
| Working example 2 | 100 | 1 | 0 | 50 | 0.06 |
| Working example 3 | 500 | 5 | 0 | 50 | 0.03 |
| Working example 4 | 500 | 5 | −100 | 95 | 0.07 |
| Comparative example 1 | 500 | 5 | −100 | 120 | 0.21 |
| Comparative example 2 | 100 | 1 | 0 | 120 | 0.12 |
| Comparative example 3 | 500 | 5 | 0 | 120 | 0.18 |
| Comparative example 4 | 80 | 0.8 | −100 | 100 | 0.15 |
| Comparative example 5 | 80 | 0.8 | −100 | 120 | 0.15 |

As shown in Table 1, the gas barrier films produced by the production method of the present invention are high quality gas barrier films having excellent gas barrier properties with a water vapor transmission rate (WVTR) of 0.1 [g/m$^2$/day] less or equal.

In contrast, the comparative examples 1 to 3 with excessive feeding tension applied to the substrate Z invariably produced deformation of the substrate Z due to the large feeding tension used for feeding when the substrate Z was softened by the heat of film formation. When the water vapor transmission rate of the gas barrier films was measured, it had deteriorated; the WVTR was invariably not less 0.1 [g/m$^2$/day], a deterioration of the water vapor transmission rate.

In comparative examples 4 and 5 in which the P/Q was too small, that is, inadequate power was used to generate the plasma, because of the small thermal load on the substrate Z during film formation, even when the feeding tension used for feeding was large (Comparative example 5), produced gas barrier films have low gas barrier properties and water vapor transmission rates of 0.1 [g/m$^2$/day] greater or equal due to the inadequate density of the formed film, despite the almost complete absence of deformation of the substrate Z.

The above results clearly show the beneficial effects of the present invention.

What is claimed is:

1. A method of manufacturing a gas barrier film, comprising:
    feeding long lengths of a substrate;
    forming a silicon nitride film as said gas barrier film on said substrate by a capacitively coupled plasma-enhanced CVD technique in a film formation area while transporting said substrate in a longitudinal direction with a tension being applied to said substrate;
    measuring said tension applied to said substrate during transporting; and
    adjusting said tension applied on said substrate so that said tension becomes a predetermined value of not more than 100 [N/m] that does not cause deformation of said substrate softened by heat during film formation and prevents damage to said silicon nitride film formed on said substrate based on measurement results of said tension applied on said substrate,
    wherein gaseous raw materials using in said forming step of said silicon nitride film includes at least silane gas and ammonia gas, and
    wherein a ratio P/Q [W/sccm] is not less than 1 when a flow rate of the silane gas is denoted as Q[sccm] and a power input for generating a capacitively coupled plasma is denoted as P[W].

2. The method of manufacturing a gas barrier film according to claim 1, wherein said step of forming said silicon nitride film performs by applying a bias potential to said substrate.

3. The method of manufacturing a gas barrier film according to claim 2, wherein said bias potential applied to said substrate is not more than −100 V.

4. The method of manufacturing a gas barrier film according to claim 1, wherein said substrate is transported by winding said substrate at a predetermined area of a circumferential surface of a cylindrical drum, and said cylindrical drum is used as one electrode of said pair of electrodes in case of forming said silicon nitride film.

5. The method of manufacturing a gas barrier film according to claim 4, wherein said tension applied to said substrate is not more than 100 [N/m] in an area of said circumferential surface of said cylindrical drum on which said substrate is wound.

6. The method of manufacturing a gas barrier film according to claim 1, wherein said ratio P/Q satisfies a relationship 1 [W/sccm] ≦ P / Q ≦ 30 [W/sccm].

7. The method of manufacturing a gas barrier film according to claim 1, wherein said tension applied to said substrate is not more than 100 [N/m] in an entire area of a transporting path for transporting said substrate in said longitudinal direction.

8. The method of manufacturing a gas barrier film according to claim 1, wherein said gaseous raw materials further includes at least one of nitrogen gas and hydrogen gas.

9. The method of manufacturing a gas barrier film according to claim 1, wherein a temperature of said substrate is not more than 70° C.

10. The method of manufacturing a gas barrier film according to claim 4, further comprising a step of adjusting a temperature of said cylindrical drum.

11. The method of manufacturing a gas barrier film according to claim 1, further comprising:
    transporting said substrate roll-to-roll from a substrate roll to a rewind roll.

12. The method of manufacturing a gas barrier film according to claim 1, wherein the substrate has at least one layer formed from organic or inorganic materials, the at least one layer being a protective layer, an adhesive layer, a light reflecting layer, a light shield layer, a planarizing layer, a buffer layer, or a stress relaxing layer.

13. The method of manufacturing a gas barrier film according to claim 1, further comprising:
    mounting a substrate roll on a rotary shaft; and
    feeding the substrate along a predetermined feeding path starting from a supply chamber and passing through a film formation chamber to reach a winding shaft in a winding chamber.

14. The method of manufacturing a gas barrier film according to claim 13, further comprising:
    forming at least some degree of vacuum in the supply chamber and the winding chamber, the vacuum being supplied by at least one vacuum pump.

15. The method of manufacturing a gas barrier film according to claim 14, wherein the at least one vacuum pump is a turbo pump, a mechanical booster pump, a dry pump, or a rotary pump.

16. The method of manufacturing a gas barrier film according to claim 2, wherein said bias potential applied to said substrate is not more than −100 V and not less than −700 V.

* * * * *